US012038308B2

(12) United States Patent
Schmitt et al.

(10) Patent No.: US 12,038,308 B2
(45) Date of Patent: Jul. 16, 2024

(54) MAGNETIC SENSOR SYSTEM HAVING AN INITIALIZATION CONDUCTOR

(71) Applicant: Analog Devices International Unlimited Company, Limerick (IE)

(72) Inventors: Jochen Schmitt, Biedenkopf (DE); Monsoon Dutt, London (GB); Enno Lage, Kiel (DE); Stephen A. Bradshaw, Hungerford (GB); Bryan Patricio Aguiar Gonzalez, London (GB)

(73) Assignee: Analog Devices International Unlimited Company, Limerick (IE)

( * ) Notice: Subject to any disclaimer, the term of this patent is extended or adjusted under 35 U.S.C. 154(b) by 101 days.

(21) Appl. No.: 17/688,331

(22) Filed: Mar. 7, 2022

(65) Prior Publication Data
US 2022/0307865 A1    Sep. 29, 2022

Related U.S. Application Data

(60) Provisional application No. 63/165,597, filed on Mar. 24, 2021.

(51) Int. Cl.
   *G01D 5/16*      (2006.01)
   *G01D 5/14*      (2006.01)

(52) U.S. Cl.
   CPC ............... *G01D 5/16* (2013.01); *G01D 5/142* (2013.01)

(58) Field of Classification Search
   CPC ................... G01R 33/02; G01R 33/06; G01R 33/09–098; G01R 33/12; G01R 33/1292;
   (Continued)

(56) References Cited

U.S. PATENT DOCUMENTS 6,522,128 B1    2/2003   Ely et al.
7,239,131 B2    7/2007   Halder et al.
(Continued)

FOREIGN PATENT DOCUMENTS

DE    102010022611    2/2015
DE    102015210585    12/2016
(Continued)

OTHER PUBLICATIONS

"United Kingdom Application Serial No. 2203980.4, Combined Search and Examination Report mailed Sep. 23, 2022", 8 pgs.
(Continued)

*Primary Examiner* — Huy Q Phan
*Assistant Examiner* — David B Frederiksen
(74) *Attorney, Agent, or Firm* — Schwegman Lundberg & Woessner, P.A.

(57) ABSTRACT

The present disclosure provides magnetic sensor system that includes a magnetic sensing device comprising a magnetic multi-turn sensor, and an initialization device for setting the magnetic multi-turn sensor in a known state ready for use. The initialization device is in the form of a substrate, such as a printed circuit board, comprising one or more wires. A strong electrical pulse is applied to the one or more wires, which thereby generate a magnetic field that is strong enough to cause the magnetoresistive elements of the magnetic multi-turn sensor to be filled with domain walls, thereby magnetizing each element into an initialized state.

22 Claims, 11 Drawing Sheets

(58) Field of Classification Search
CPC ............ G01D 5/12; G01D 5/14; G01D 5/142; G01D 5/145; G01D 5/16
See application file for complete search history.

(56) References Cited

U.S. PATENT DOCUMENTS

| | | | |
|---|---|---|---|
| 7,562,591 | B2 | 7/2009 | Lee |
| 8,766,625 | B2 | 7/2014 | Mehnert et al. |
| 9,151,807 | B2 | 10/2015 | Friedrich et al. |
| 9,534,932 | B2* | 1/2017 | Granig .................... G01D 5/16 |
| 9,869,565 | B2 | 1/2018 | Musha et al. |
| 10,228,267 | B2 | 3/2019 | Mattheis et al. |
| 10,415,997 | B2 | 9/2019 | Huber Lindenberger et al. |
| 10,725,100 | B2 | 7/2020 | Milano et al. |
| 10,948,554 | B2 | 3/2021 | Deak et al. |
| 10,962,386 | B2 | 3/2021 | Mattheis et al. |
| 2004/0113188 | A1* | 6/2004 | Schmidt ................ G01R 33/09 257/295 |
| 2017/0178803 | A1* | 6/2017 | Kim ...................... H02J 50/005 |
| 2017/0261345 | A1* | 9/2017 | Schmitt ............... G11C 11/1673 |
| 2018/0340987 | A1 | 11/2018 | Latham et al. |
| 2018/0356252 | A1 | 12/2018 | Diegel et al. |
| 2018/0372510 | A1 | 12/2018 | Mattheis et al. |
| 2019/0195613 | A1* | 6/2019 | Zimmer ............... G01R 33/093 |
| 2019/0195661 | A1* | 6/2019 | Mano ................... G01R 33/072 |
| 2019/0383645 | A1 | 12/2019 | Tonge et al. |
| 2020/0292636 | A1* | 9/2020 | Ohta .................... H01F 10/3268 |
| 2020/0300938 | A1 | 9/2020 | Schmitt et al. |
| 2020/0355758 | A1 | 11/2020 | Tanabe et al. |
| 2020/0408567 | A1 | 12/2020 | Schmitt |
| 2021/0033425 | A1 | 2/2021 | Cosgrave |
| 2021/0041267 | A1 | 2/2021 | Tonge et al. |
| 2021/0223334 | A1* | 7/2021 | Granig .................... G01D 5/56 |
| 2024/0004001 | A1 | 1/2024 | Schmitt et al. |

FOREIGN PATENT DOCUMENTS

| | | |
|---|---|---|
| EP | 1306687 | 5/2003 |
| EP | 3244226 | 11/2017 |
| EP | 2181308 | 10/2019 |
| EP | 3387387 B1 | 10/2019 |
| EP | 3534121 | 1/2021 |
| EP | 3771916 A1 | 2/2021 |
| JP | 5216462 | 3/2013 |

OTHER PUBLICATIONS

"United Kingdom Application Serial No. 2203980.4, Subsequent Examination Report under Section 18 (3) mailed May 31, 2023", 5 pgs.

"German Application Serial No. 102020132914.8, Office Action mailed Sep. 16, 2021", w/o English translation, 9 pgs.

"United Kingdom Application Serial No. 2314565.9, Combined Search and Examination Report under Section 17 and 18(3) mailed Nov. 21, 2023", 5 pgs.

"United Kingdom Application Serial No. 2314565.9, Response filed Apr. 15, 2024 to Subsequent Examination Report under Section 18 (3) mailed Apr. 5, 2024".

"United Kingdom Application Serial No. 2314565.9, Subsequent Examination Report under Section 18 (3) mailed Apr. 5, 2024", 2 pgs.

* cited by examiner

MAGNETIC SENSOR SYSTEM HAVING AN INITIALIZATION CONDUCTOR

FIELD OF THE INVENTION

The present disclosure relates to a magnetic sensor system. In particular, the present disclosure relates to a magnetic sensor system comprising a magnetic sensing device and an initialization device.

BACKGROUND

Magnetic multi-turn (MT) sensors are commonly used in applications where there is a need to monitor the number of times a device has been turned. An example is a steering wheel in a vehicle. Magnetic multi-turn sensors typically use magnetoresistive elements that are sensitive to an applied external magnetic field. The resistance of the magnetoresistive elements in multi-turn sensors can be changed by rotating a magnetic field within the vicinity of the sensor. Variations in the resistance of the magnetoresistive elements can be tracked to determine the number of turns in the magnetic field, which can be translated to a number of turns in the device being monitored.

The magnetic turn count information stored in the sensor needs to match the physical turn count of the device the sensor is monitoring, and so the sensor must first be set in a known magnetic state before it can be used. The magnetoresistive elements therefore need to be magnetically initialized into one of two states, such that all the sensor outputs will be the same at either the start point of the mechanical system (i.e. zero turns of the magnetic field) or the end point (i.e. the maximum number of turns that the sensor can count), for example, all having either a "high" reading or a "low reading". This is called the initialization state.

SUMMARY

The present disclosure provides magnetic sensor system that includes a magnetic sensing device comprising a magnetic multi-turn sensor, and an initialization device for setting the magnetic multi-turn sensor in a known state ready for use. The initialization device is in the form of a substrate, such as a printed circuit board, comprising one or more wires. A strong electrical pulse is applied to the one or more wires, which thereby generate a magnetic field that is strong enough to cause the magnetoresistive elements of the magnetic multi-turn sensor to be filled with domain walls, thereby magnetising each element into an initialized state.

A first aspect of the present disclosure provides a magnetic sensor system, comprising a substrate, a magnetic sensing device mounted on a first surface of the substrate, the magnetic sensing device at least comprising a magnetic multi-turn sensor, wherein the magnetic mufti-turn sensor comprises a plurality of magnetoresistive sensing elements, and at least one electrical conductor arranged in or on the substrate in proximity to the magnetic sensing device, wherein the conductor is configured to generate a magnetic field when a current pulse is applied thereto, such that domain walls are generated in the plurality of magnetoresistive elements.

In use, a current pulse is applied to the electrical conductor, which generates an additional magnetic field in the vicinity of the sensing system. This additional magnetic field, alone or in combination with the magnetic field generated by a nearby magnet (e.g., mounted on a mechanical system to be monitored), causes domain wall nucleation within the multi-turn sensor to thereby initialize it into a known magnetic state. As such, once the magnetic sensing system is installed within a system to be monitored, the multi-turn sensor can be easily initialized at any time without the need for large external magnetic fields, by applying a current pulse to the electrical conductor. The use of a conductor therefore provides an effective, but easy to manufacture, initialization device, whereby the multi-turn sensor can be initialized once the magnetic sensor package has already been installed in a system.

In some arrangements, the at least one electrical conductor may be embedded within the substrate. In such cases, the at least one electrical conductor may be embedded within the substrate a first distance from the first surface of the substrate. For example, the at least one electrical conductor may be positioned within the substrate to ensure it is a predefined distance from the magnetic sensing device, to thereby ensure that the multi-turn sensor experiences a strong enough magnetic field to nucleate domain walls when a current is applied to the conductor. As one example, the electrical conductor may be 0.5 mm from the surface of the substrate to ensure it is around 2 mm from the magnetic sensing device.

The at least one electrical conductor may be arranged in a planar coil configuration, wherein the magnetic sensing device is positioned above at least a portion of the planar coil configuration. For example, the planar coil configuration may comprise at least two planar coils, wherein the magnetic sensing device is positioned above at least one side of each of the at least two planar coils. That is to say, the conductor may be arranged as two planar spirals arranged in parallel within the substrate so that one side of one spiral is side by side with one side of the other spiral, with the magnetic sensing device being placed above this region.

In other arrangements, the at least one electrical conductor comprises a first set of electrical conductors embedded within the substrate, and a second set of electrical conductors mounted on the first surface of the substrate, the second set of electrical conductors being connected to the first set of electrical conductors, and formed over the magnetic sensing device.

In such cases, the second set of electrical conductors may be arranged in an arch configuration over the magnetic sensing device.

In further arrangements, the at least one electrical conductor may comprise a coil mounted on a second surface of the substrate. For example, the coil may be a solenoid coil.

In some arrangements, the substrate may comprise a printed circuit board.

The magnetic multi-turn sensor may be a giant magnetoresistive (GMR) or tunnel magnetoresistive (TMR) based multi-turn sensor.

A further aspect of the present disclosure provides a method of initializing a magnetic sensing device, the method comprising providing a magnetic sensing device on a first surface of a substrate, the magnetic sensing device at least comprising a magnetic multi-turn sensor, wherein the magnetic multi-turn sensor comprises a plurality of magnetoresistive sensing elements, providing at least one electrical conductor in or on the substrate in proximity to the magnetic sensor, applying a current pulse to the at least one electrical current to thereby generate a magnetic field in the vicinity of the magnetic sensing device, such that domain walls are generated in the plurality of magnetoresistive elements.

BRIEF DESCRIPTION OF THE DRAWINGS

The present disclosure will now be described by way of example only with reference to the accompanying drawings in which.

DETAILED DESCRIPTION

Magnetic multi-turn sensors can be used to monitor the turn count of a rotating shaft. To do this, a magnet is typically mounted to the end of the rotating shaft, the multi-turn sensor being sensitive to the rotation of the magnetic field as the magnet rotates with the shaft. Such magnetic sensing can be applied to a variety of different applications, such as automotive applications, medical applications, industrial control applications, consumer applications, and a host of other applications which require information regarding a position of a rotating component.

For counting the number of turns, an xMR multi-turn sensor, typically, giant magnetoresistive (GMR) or tunnel magnetoresistive (TMR), based on domain wall propagation in an open or closed loop spiral is used. The multi-turn sensor may then be used in conjunction with an xMR angle sensor (also referred to as a single turn sensor) for determining the angular position of the rotating shaft within each 360° turn.

Figure 1:
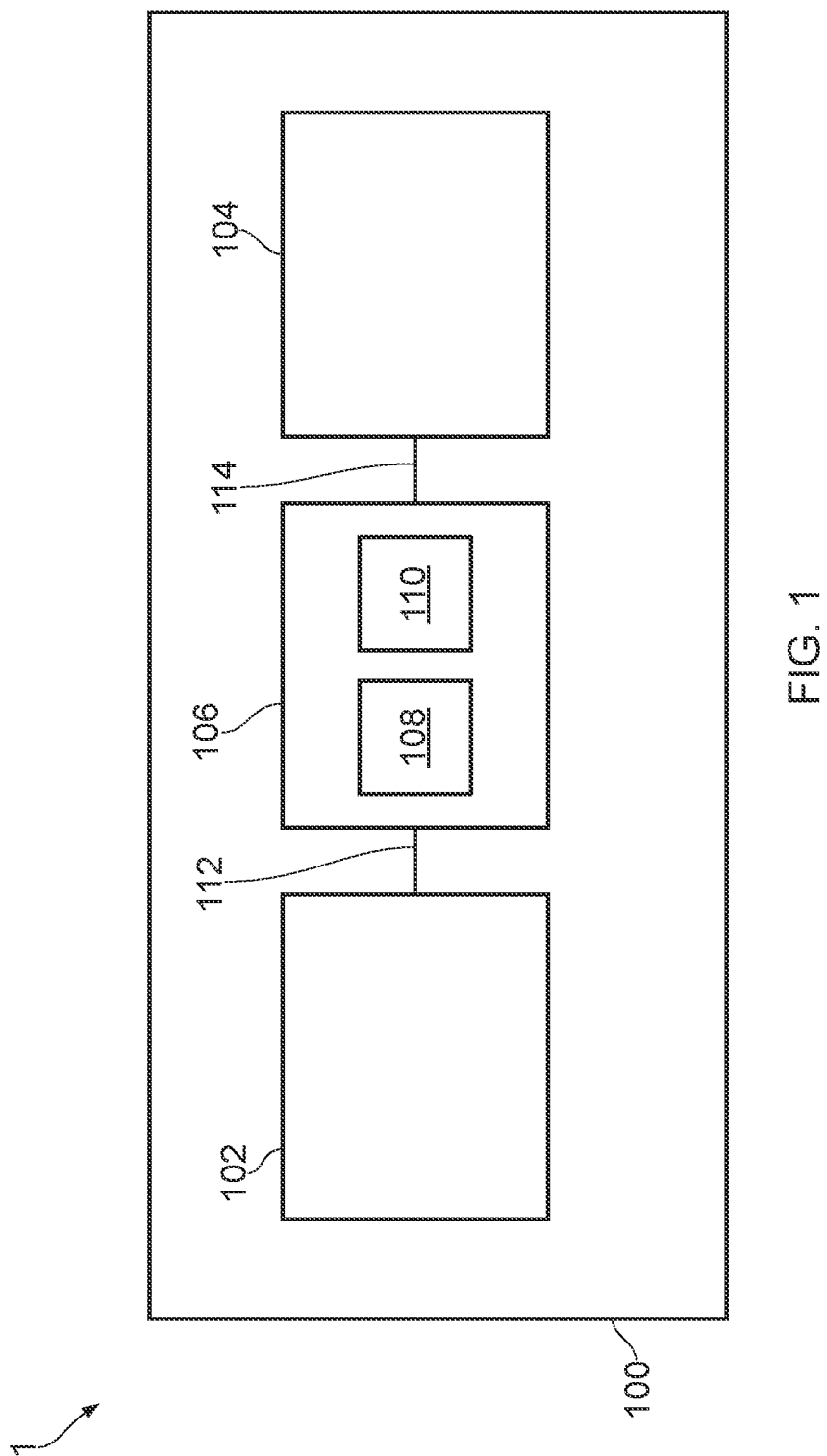
FIG. 1 is an example of a magnetic multi-turn sensor in accordance with embodiments of the disclosure.

FIG. 1 illustrates a schematic block diagram of an example magnetic sensor system 1 that includes an xMR multi-turn (MT) sensor 102. The magnetic sensor system 1 may also include a magnetic single turn (ST) sensor 104, which may be an anisotropic magnetoresistive (AMR), giant magnetoresistive (GMR) or tunnel magnetoresistive (TMR) based position sensor, although it will be appreciated that the magnetic sensor system 1 may be implemented without the ST sensor 104 or with a different type of magnetic angle sensor.

The sensor system 1 also comprises a processing circuit 106, and an integrated circuit 100 on which the MT sensor 102, the ST sensor 104 and processing circuit 106 are disposed. The processing circuit 106 receives signals SNIT 112 from the MT sensor 102 and processes the received signals to determine that the turn count using a turn count decoder 108, which will output a turn count representative of the number of turns of an external magnetic field (not shown) rotating in the vicinity of the MT sensor 102. Similarly, the processing circuit 106 may also receive signals SST 114 from the ST sensor 104 and process the received signals using a position decoder 110 to output an angular position of the external magnetic field.

Figure 2:
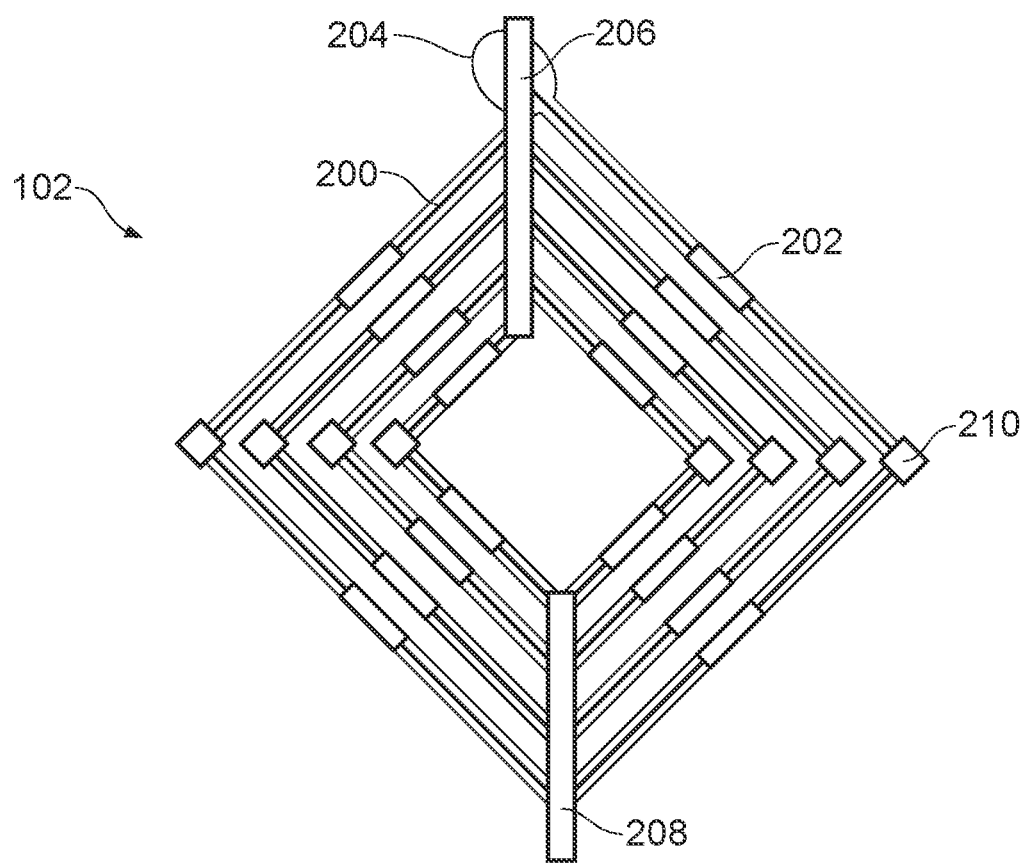
FIG. 2 is a schematic top view of a magnetic sensor package in accordance with embodiments of the disclosure.

FIG. 2 shows an example of a magnetic strip layout representation of the magnetic MT sensor 102 comprising a plurality of magnetoresistive elements 200 that may be used in accordance with the embodiments of the present disclosure. In the example of FIG. 2, the magnetic strip 200 is a giant magnetoresistance (GMR) track that is physically laid out in an open loop spiral configuration, although it will be appreciated that the sensor may also be formed from tunnel magnetoresistive (TMR) material. As such, the magnetic strip 200 has a plurality of segments formed of the magnetoresistive elements 202 arranged in series with each other. The magnetoresistive elements 202 act as variable resistors that change resistance in response to a magnetic alignment state. One end of the magnetic strip 200 is coupled to a domain wall generator (DWG) 204. In this respect, it will be appreciated that the DWG 204 may be coupled to either end of the magnetic strip 200. The DWG 204 generates domain walls in response to rotations in an external magnetic field, or the application of some other strong external magnetic field beyond the operating magnetic window of the sensor 102. These domain walls can then be injected into the magnetic strip 200. As the magnetic domain changes, the resistance of the GMR elements 202 will also change due to the resulting change in magnetic alignment.

In order to measure the varying resistance of the GMR elements 202 as domain walls are generated, the magnetic strip 200 is electrically connected to a supply voltage VDD 206 and to ground GND 208 to apply a voltage between a pair of opposite corners. The corners half way between the voltage supplies are provided with electrical connections 210 so as to provide half-bridge outputs. As such, the multi-turn sensor 102 comprises multiple Wheatstone bridge circuits, with each half-bridge 210 corresponding to one half-turn or 180° rotation of an external magnetic field. Measurements of voltage at the electrical connections 210 can thus be used to measure changes in the resistance of the GMR elements 202, which is indicative of changes in the magnetic alignment of the free layer.

The example shown by FIG. 2 comprises four spiral windings eight half-bridges 210, and is thus configured to count four turns of an external magnetic field. However, it will be appreciated that a multi-turn sensor may have any number of spiral windings depending on the number of GMR elements. In general, multi-turn sensors can count as many turns as spiral windings. It will also be appreciated that the GMR elements 202 may be electrically connected in any suitable way so as to provide sensor outputs representative of the changes in magnetic alignment state. For example, the GMR elements 202 may be connected in a matrix arrangement such as that described in US 2017/0261345, which is hereby incorporated by reference in its entirety. As a further alternative, each magnetoresistive element 202 may be connected individually, rather than in a bridge arrangement.

As described above, the magnetic turn count information stored in the MT sensor 102 needs to match the physical turn count of the device the MT sensor 102 is monitoring, and so the MT sensor 102 must first be set in a known magnetic state before it can be used. To initialize the MT sensor 102, the mechanical system needs to be driven to either the start or end position, and the sensor spiral filled with domain walls such that the GMR elements 202 all provide the same sensor outputs. Once this has been done, the MT sensor 102 will output a sequence of output signals as the mechanical system rotates that is indicative of the number of turns. The initialization can be done by exposing the MT sensor 102 to a strong magnetic field, however, current solutions are difficult to implement once the magnetic sensor package 100 is assembled and installed in the mechanical system.

Figure 3:
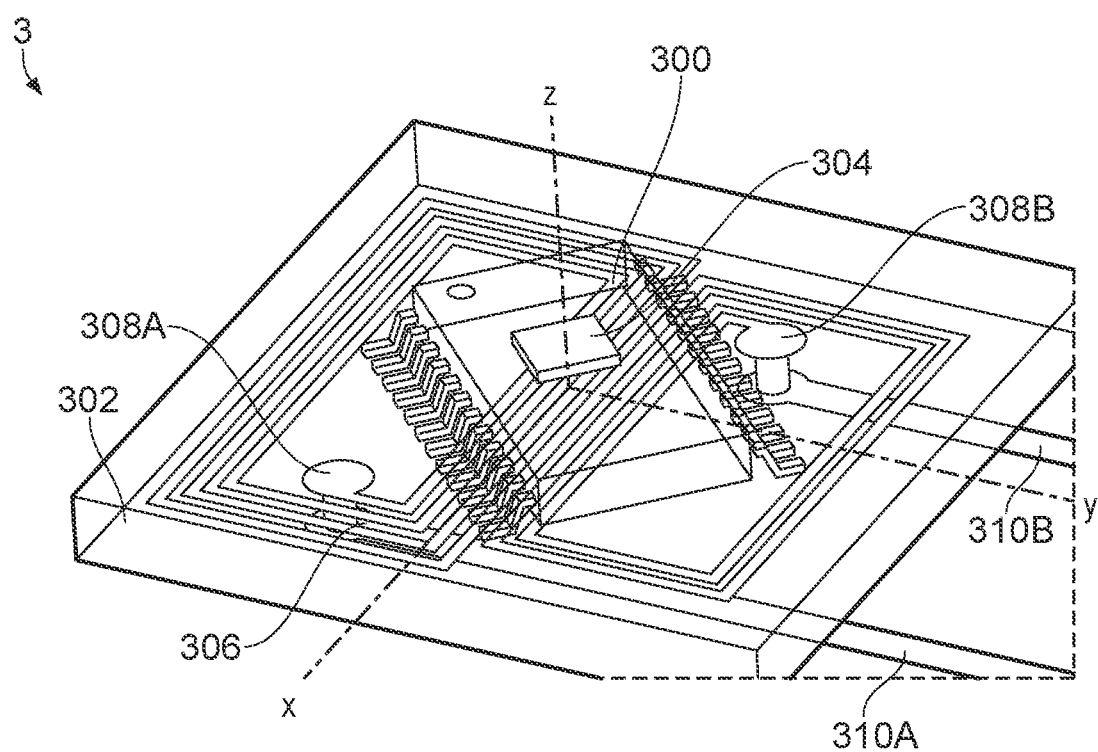
FIG. 3 is an example of magnetic sensor system in accordance with embodiments of the disclosure.
Figure 4:
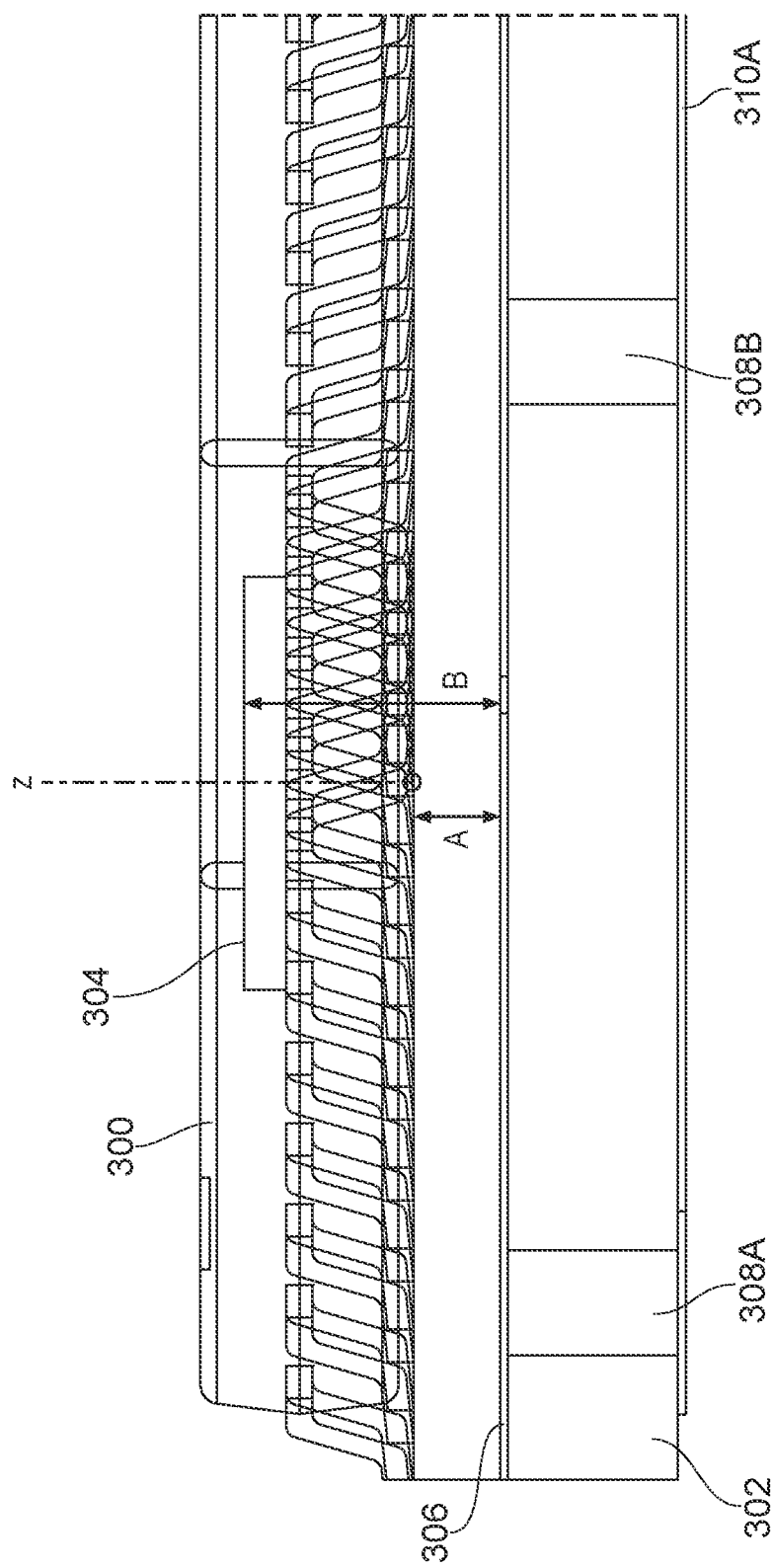
FIG. 4 is a partial side view of the magnetic sensor system of FIG. 3.

FIGS. 3 to 6 illustrate a first example of a magnetic sensor system 3 according to the present disclosure. As shown in FIG. 3, a magnetic sensor package 300 comprising a magnetic MT sensor 304 is provided. It will be appreciated that the magnetic sensor package 300 may contain the magnetic sensor system 1 shown in FIG. 1, with the MT sensor 304 being the MT sensor 102. It will thus be appreciated that FIGS. 3 and 4 show only the magnetic MT sensor 304 for exemplary purposes, and that other features of the magnetic sensor package 300 have been omitted from the drawings. The magnetic sensor package 300 is positioned on substrate 302, for example, a printed circuit board (PCB), in which an electrical conductor, shown herein in the form of a wire 306, is integrated. In this example, the initialization wire 306 is arranged in planar coil configuration comprising two spirals, however, it will be appreciated that the initialization wire 306 may be arranged any suitable configuration provided the magnetic sensor package 300 is positioned adjacent to at least a portion of the initialization wire 306 for reasons that are explained below.

To initialize the MT sensor 304, a magnetic field pulse is generated by applying a strong current pulse to the initialization wire 306. In this respect, the initialization wire 306 comprises two connection terminals 308A-B that are connected to two connecting wires 310A-B for connecting to a power supply (not shown). The magnetic field generated by the initialization wire 306, plus any magnetic field already being generated, for example, by the rotating magnet of the mechanical system (not shown), results in a magnetic field that is stronger than the upper limit of the operating window of the MT sensor 304. For example, a 10 microsecond pulse of approximately 50 A will result in a 25 mT magnetic field. As such, in practice, the superposition of the magnetic field generated by the nearby magnet of the mechanical system and the magnetic field generated by the current pulse in the wire 305 sum to generate a magnetic field that goes beyond the operating window of the MT sensor 304. This results in the magnetoresistive elements of the MT sensor 304 being nucleated with domain walls, thereby magnetising all of the magnetoresistive elements into the same magnetic state. To ensure that the physical state of the mechanical system matches the magnetic state of the initialized MT sensor 304, it is important that the magnet installed on the mechanical system has been aligned so that it matches the direction of the magnetic field to be applied. As such, this arrangement provides an effective, but easy to manufacture, device for initializing a MT sensor 304 that can be implemented once the magnetic sensor package 300 has already been installed in a system.

It will of course be appreciated however that the initialization may still be performed in cases where a magnet is not within the vicinity of the sensor system 3, using the magnet field generated by the initialization wire 306. In such cases, the current pulse applied to the initialization wire 306 must be strong enough to generate a magnetic field that is above the upper limit of the operating window of the MT sensor 304, whereby domain wall nucleation occurs.

Figure 6:
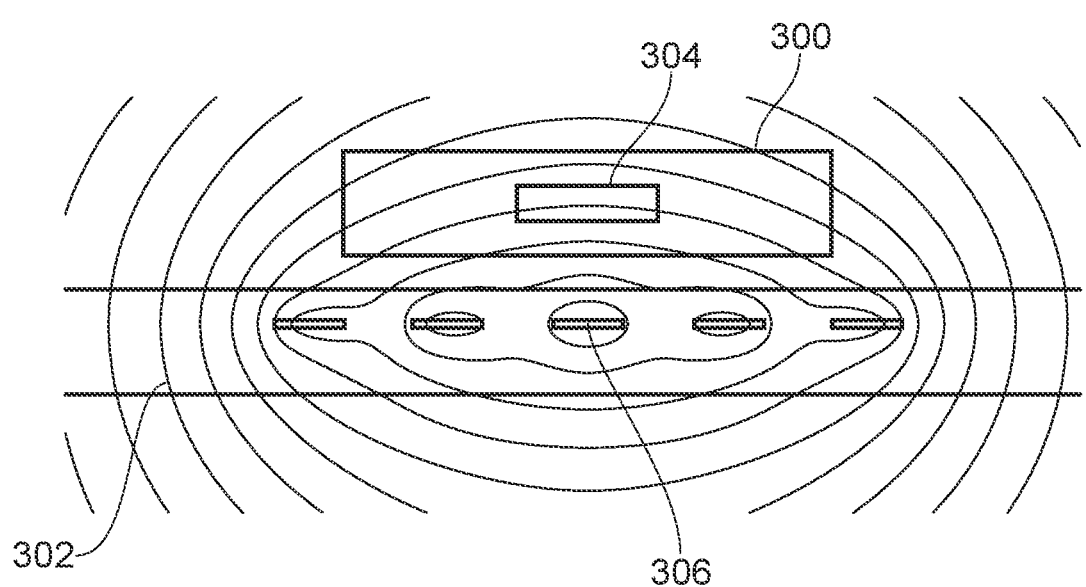
FIG. 6 is a diagram illustrating the magnetic field of an initialization device in accordance with embodiments of the disclosure.

FIG. 6 illustrates the field lines of the magnetic field generated by the integrated wire 306. As can be seen, by placing the magnetic sensor package 300 so that the MT sensor 304 is directly above the coils 306, the MT sensor 304 experiences the magnetic field generated by the wire 306 at one of its strongest points, as illustrated by the field lines being closer together. As such, by arranging the wire 306 as a coil so that there is a high density of wire in the region of the MT sensor 304, a stronger magnetic field can be generated in that region. It will however be appreciated that a single length of wire 306 may be provided below the MT sensor 304 with substantially the same desired effect.

The initialization wire 306 is advantageously arranged within an inner layer of the substrate 302 so that the top layer of the substrate 302 is free for mounting the magnetic sensor package 300, whilst still being sufficiently close enough to the MT sensor 304 to ensure that the magnetic field generated by the wire 306 is sufficiently strong enough in the region of the MT sensor 304 to cause domain wall nucleation. As such, the wire 306 may be a first distance A from the surface of the substrate 302 to ensure it is within a second distance B of the MT sensor 304, as shown in FIG. 4. As an example, to ensure the wire 306 is within 2 mm of the MT sensor 304, it may be positioned approximately 0.5 mm from the surface of the substrate 302.

Figure 5:
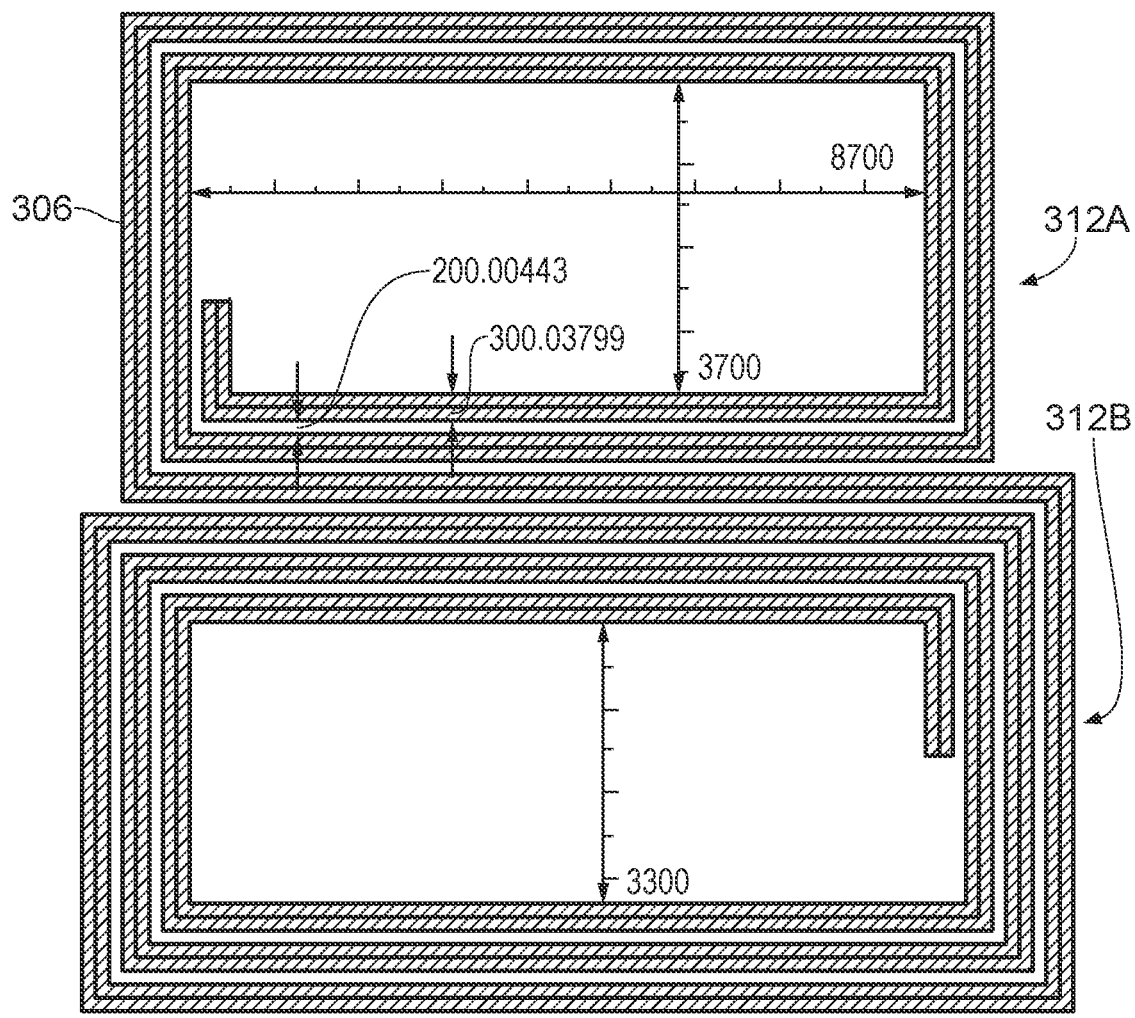
FIG. 5 is a schematic plan view of an initialization device in accordance with embodiments of the disclosure.

FIG. 5 provides an example of the dimensions of the coiled wire 306. In this example, the wire 306 forms two spirals 312A-B that have an internal width of around 3300 µm to 3700 µm, and internal length of around 8700 µm. The wire 306 may have a width of around 300 µm, and the distance between arms of the coil may be around 200 µm. However, it will be appreciated that any suitable configuration or size may be provided.

Figure 7:
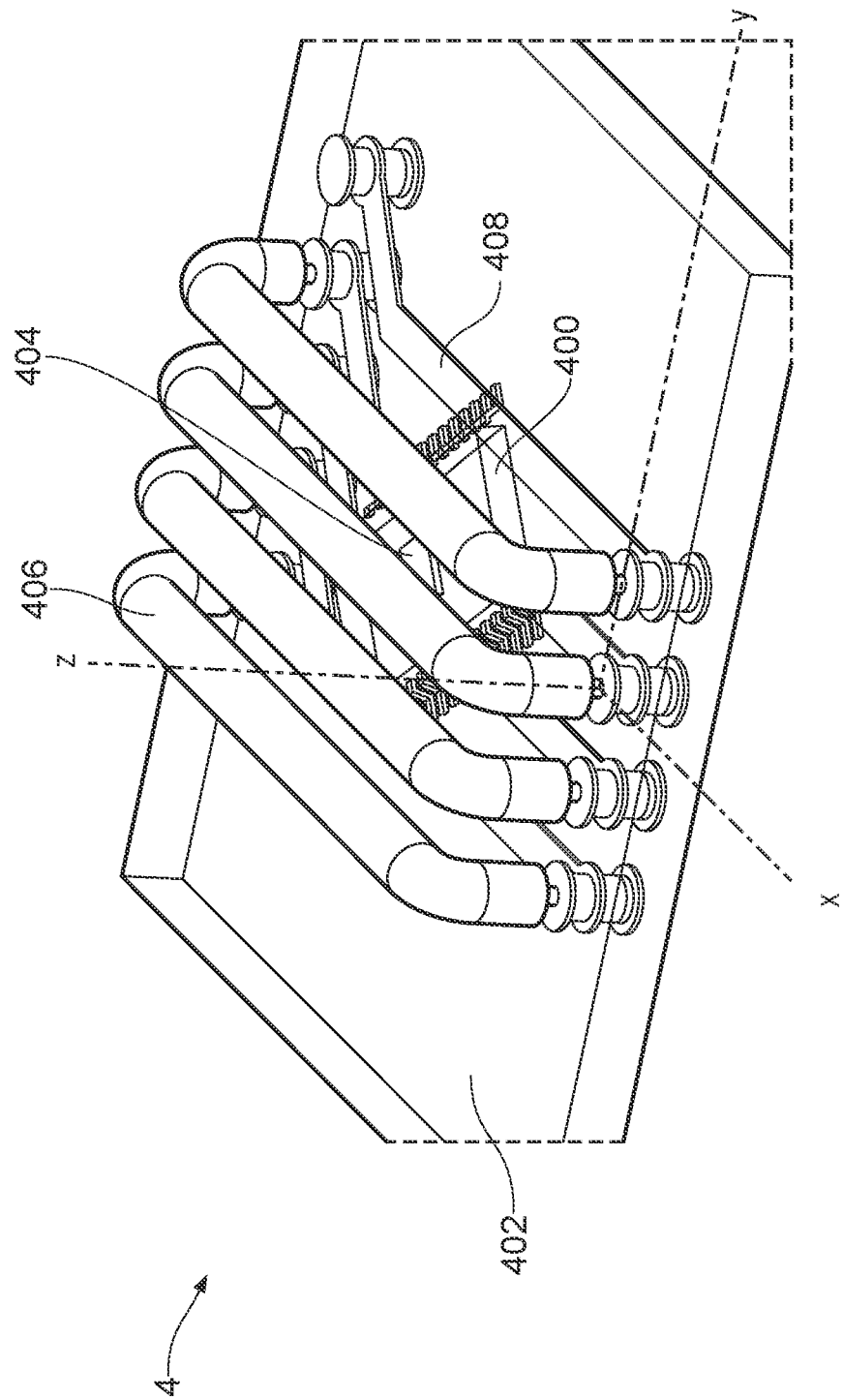
FIG. 7 is another example of magnetic sensor system in accordance with embodiments of the disclosure.
Figure 8:
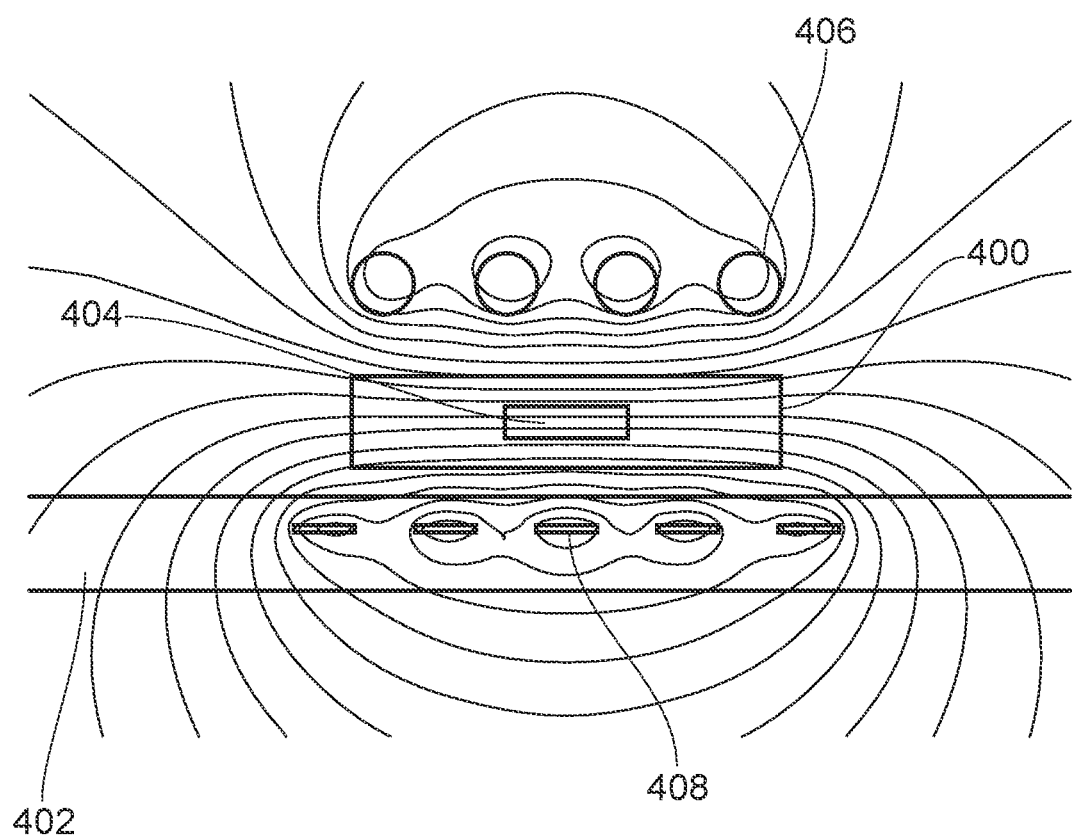
FIG. 8 is a diagram illustrating the magnetic field of an initialization device in accordance with embodiments of the disclosure.

FIGS. 7 and 8 illustrate another example of a magnetic sensor system 4 according to the present disclosure. As with the example shown in FIG. 3, magnetic sensor system 4 comprises a magnetic sensor package 400 comprising a magnetic MT sensor 404, wherein the magnetic sensor package 400 is positioned on substrate 402. However, in this case, a plurality of wires 406, 408 are provided, a first set of wires 406 arranged over the top of the magnetic sensor package 400 and connected to a second set of wires 408 integrated in the substrate 402. The first set of wires 406 may be, for example, ribbon wires or they may be soldered surface mounted. As with the previous embodiment, the wires 406, 408 may be arranged such that they are within an optimum distance from the MT sensor 404, for example, within 2 mm of the MT sensor 404.

As before, a strong pulsed current is applied to the wires 406, 408, which generate a magnetic field that is strong enough to fill the magnetoresistive spiral of the MT sensor 404 with domain walls. In this respect, FIG. 8 illustrates the field lines of the magnetic field generated by the wires 406, 408. Here, the majority of the field lines going through the centre of the wires 406, 408 are highly concentrated around the MT sensor 404, thus ensuring that the MT sensor 404 experiences a magnetic field strong enough to nucleate the sensor spiral with domain walls.

Figure 9:
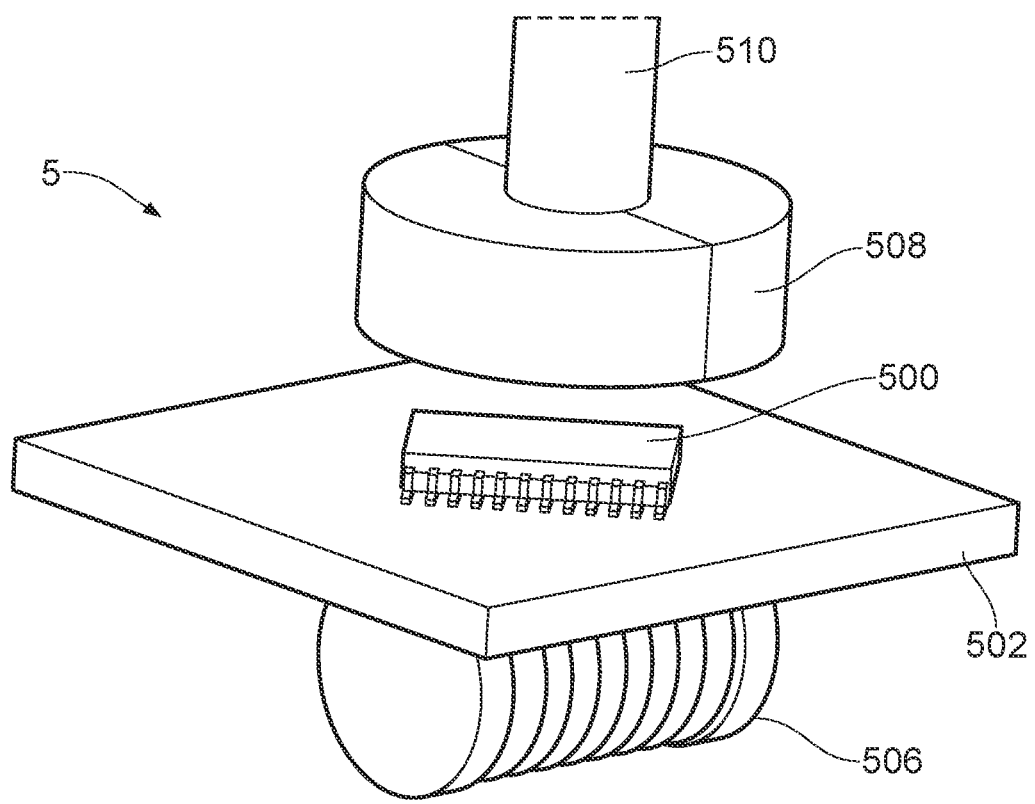
FIG. 9 is a further example of magnetic sensor system in accordance with embodiments of the disclosure.
Figure 10:
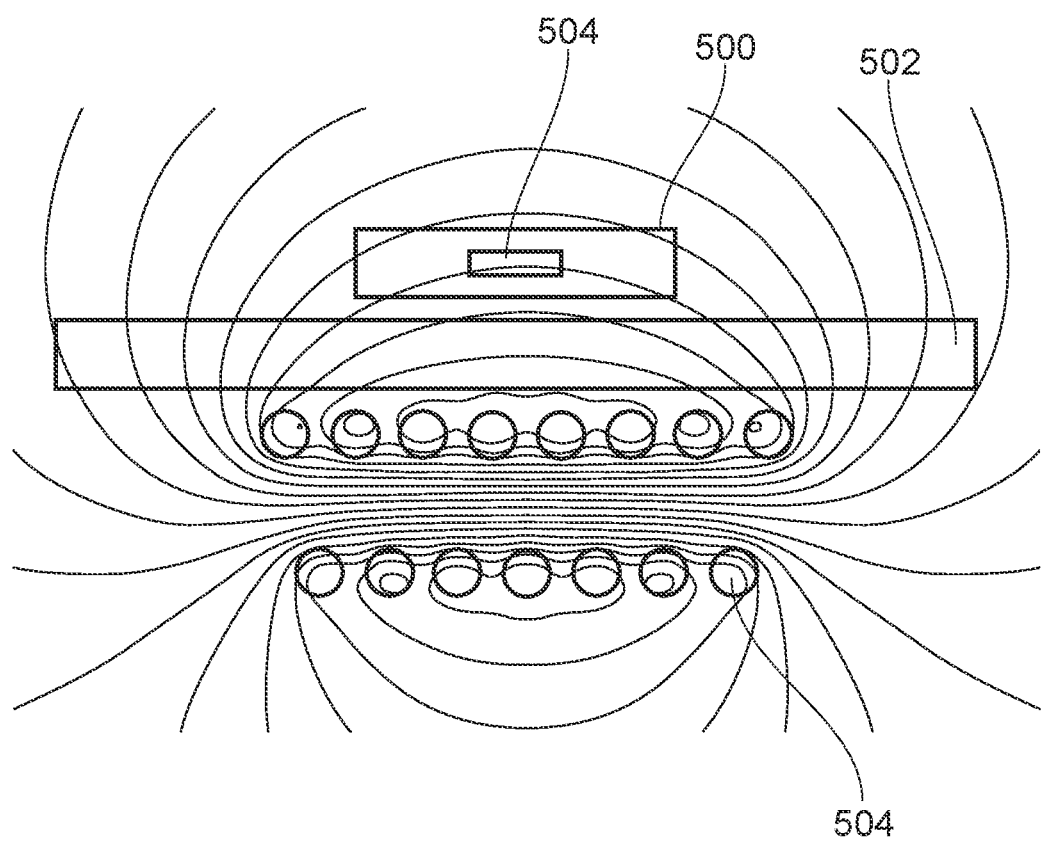
FIG. 10 is a diagram illustrating the magnetic field of an initialization device in accordance with embodiments of the disclosure.

FIGS. 9 and 10 illustrate another example of a magnetic sensor system 5 according to the present disclosure. As with the previous examples, the magnetic turn count system 5 comprises a magnetic sensor package 500 comprising a magnetic MT sensor 504, wherein the magnetic sensor package 500 is mounted on a surface of a substrate 502. However, in this case, a coiled wire 506, for example, in the form of a solenoid, is provided on the opposite side of the substrate 502. FIG. 9 also shows how the magnetic sensor system 5 may be positioned in proximity to a magnet 508 mounted to the end of a rotating shaft 510, the magnetic sensor package 500 thus being used to monitor the rotation of the magnet 508 and shaft 510 arrangement. It will of course be appreciated that the embodiments described above may be similarly positioned in proximity to a magnet mounted to the end of a rotating shaft.

As before, a strong pulsed current is applied to the coil 506, which generates a magnetic field that is strong enough to fill the magnetoresistive spiral of the MT sensor 504 with domain walls. In this respect, FIG. 10 illustrates the field lines of the magnetic field generated by the coil 506. Here, the majority of the field lines go through the centre of the coil 506, but the field on top of the coil 506 that are passing though the MT sensor 504 are still sufficiently strong enough to nucleate the sensor spiral with domain walls.

Figure 11:
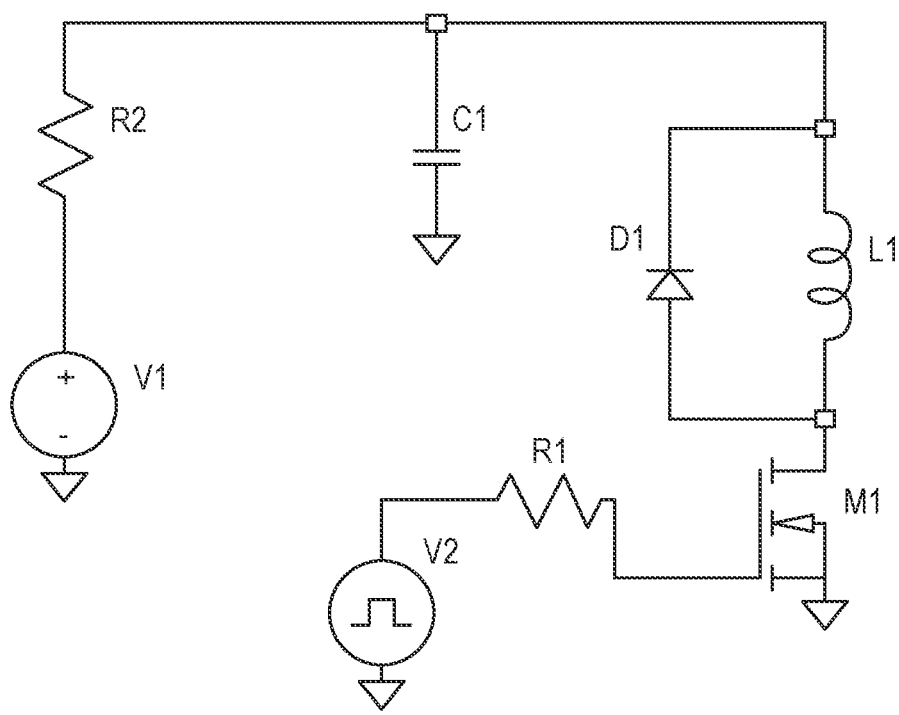
FIG. 11 is a schematic diagram illustrating the circuitry of an initialization device in accordance with embodiments of the disclosure.

FIG. 11 is a circuit diagram illustrating how a current pulse generator can be used to apply the magnetic field pulse in any of the above examples, wherein the coil or wire used for field generation is illustrated by L1. A voltage source V1 is used to charge a capacitor C1 through a resistor R2. The resistor R2 is important to avoid voltage drops at V1 when the capacitor C1 is suddenly discharged. A current pulse can be generated by opening a transistor switch M1. In this example, this is done by the pulse generator V2 which charges the gate capacity through R1, with the capacitor C1 subsequently discharging through the wire L1. After reaching a sufficient current in the wire L1 to apply the necessary magnetic field to nucleate the domain walls, the transistor M1 can be switched off. At that point, the wire L1 will still be charged and will need to be discharged through a flyback diode D1. The resistor R1 can also be used to reduce the rise and fall time of the current pulse, which may be important for reducing very big changes in voltage and current, as these sharp transients can cause electromagnetic waves that can cause electromagnetic compatibility (EMC) problems.

Various modifications, whether by way of addition, deletion and/or substitution, may be made to all of the above described embodiments to provide further embodiments, any and/or all of which are intended to be encompassed by the appended claims. For example, the above arrangements may be combined with a device for shielding the magnetic sensor package from stray magnetic fields, which may be in the form of ferromagnetic shield placed around the magnet and/or a below the PCB substrate.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure, indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A magnetic sensor system, comprising:
   a substrate;
   a magnetic sensing device having an initialized magnetic state and mounted on a first surface of the substrate, the magnetic sensing device at least comprising a magnetic multi-turn sensor, wherein the magnetic multi-turn sensor comprises a plurality of magnetoresistive sensing elements, wherein in the initialized magnetic state, outputs of the magnetic sensing device are in a known magnetic state; and
   an initialization device configured for placing the magnetic sensing device in the initialized magnetic state prior to using the magnetic sensing device, the initialization device including:
      at least one electrical conductor arranged in or on the substrate in proximity to the magnetic sensing device, wherein the at least one electrical conductor is configured to generate a magnetic field when a current pulse is applied thereto, such that domain walls are generated in the plurality of magnetoresistive sensing elements so as to magnetize each of the plurality of magnetoresistive sensing elements into the initialized magnetic state prior to using the magnetic sensing device.

2. A magnetic sensor system according to claim 1, wherein the at least one electrical conductor is embedded within the substrate.

3. A magnetic sensor system according to claim 2, wherein the at least one electrical conductor is embedded within the substrate a first distance from the first surface of the substrate.

4. A magnetic sensor system according to claim 1, wherein the at least one electrical conductor is arranged in a planar coil configuration, and wherein the magnetic sensing device is positioned above at least a portion of the planar coil configuration.

5. A magnetic sensor system according to claim 4, wherein the planar coil configuration comprises at least two planar coils.

6. A magnetic sensor system according to claim 5, wherein the magnetic sensing device is positioned above at least one side of each of the at least two planar coils.

7. A magnetic sensor system according to claim 1, wherein the at least one electrical conductor comprises:
a first set of electrical conductors embedded within the substrate; and
a second set of electrical conductors mounted on the first surface of the substrate, the second set of electrical conductors being connected to the first set of electrical conductors, and formed over the magnetic sensing device.

8. A magnetic sensor system according to claim 7, wherein the second set of electrical conductors are arranged in an arch configuration over the magnetic sensing device.

9. A magnetic sensor system according to claim 1, wherein the at least one electrical conductor comprises a coil mounted on a second surface of the substrate.

10. A magnetic sensor system according to claim 9, wherein the coil is a solenoid coil.

11. A magnetic sensor system according to claim 1, wherein the substrate comprises a printed circuit board.

12. A magnetic sensor system according to claim 1, wherein the magnetic multi-turn sensor is a giant magnetoresistive (GMR) or tunnel magnetoresistive (TMR) based multi-turn sensor.

13. A method of initializing a magnetic sensing device, the method comprising:
providing a magnetic sensing device on a first surface of a substrate, the magnetic sensing device having an initialized magnetic state and at least comprising a magnetic multi-turn sensor, wherein the magnetic multi-turn sensor comprises a plurality of magnetoresistive sensing elements;
providing an initialization device having at least one electrical conductor in or on the substrate in proximity to the magnetic multi-turn sensor, the initialization device configured for placing the magnetic sensing device in the initialized magnetic state prior to using the magnetic sensing device;
applying a current pulse to the at least one electrical conductor to thereby generate a magnetic field in the vicinity of the magnetic sensing device, such that domain walls are generated in the plurality of magnetoresistive sensing elements so as to magnetize each of the plurality of magnetoresistive sensing elements into the initialized magnetic state prior to using the magnetic sensing device.

14. A method according to claim 13, wherein the at least one electrical conductor is embedded within the substrate.

15. A method according to claim 14, wherein the at least one electrical conductor is embedded within the substrate a first distance from the first surface of the substrate.

16. A method according to claim 13, wherein the at least one electrical conductor is arranged in a planar coil configuration, and wherein the magnetic sensing device is positioned above at least a portion of the planar coil configuration.

17. A method according to claim 13, wherein the at least one electrical conductor comprises:
a first set of electrical conductors embedded within the substrate; and
a second set of electrical conductors mounted on the first surface of the substrate, the second set of electrical conductors being connected to the first set of electrical conductors, and formed over the magnetic sensing device.

18. A method according to claim 17, wherein the second set of electrical conductors are arranged in an arch configuration over the magnetic sensing device.

19. A method according to claim 13, wherein the at least one electrical conductor comprises a coil mounted on a second surface of the substrate.

20. A method according to claim 19, wherein the coil is a solenoid coil.

21. A magnetic sensor system, comprising:
a substrate;
a magnetic sensing device having an initialized magnetic state and mounted on a first surface of the substrate, the magnetic sensing device at least comprising a magnetic multi-turn sensor, wherein the magnetic multi-turn sensor comprises a plurality of magnetoresistive sensing elements, wherein in the initialized magnetic state, outputs of the magnetic sensing device are in a known magnetic state; and
an initialization device configured for placing the magnetic sensing device in the initialized magnetic state prior to using the magnetic sensing device, the initialization device including:
at least one electrical conductor embedded within the substrate and in proximity to the magnetic sensing device, wherein the at least one electrical conductor is configured to generate a magnetic field when a current pulse is applied thereto, such that domain walls are generated in the plurality of magnetoresistive sensing elements so as to magnetize each of the plurality of magnetoresistive sensing elements into the initialized magnetic state prior to using the magnetic sensing device,
wherein the at least one electrical conductor is arranged in a planar coil configuration, and wherein the magnetic sensing device is positioned above at least a portion of the planar coil configuration.

22. A magnetic sensor system according to claim 21, wherein the magnetic multi-turn sensor is a giant magnetoresistive (GMR) or tunnel magnetoresistive (TMR) based multi-turn sensor.

* * * * *